US010986711B2

(12) United States Patent
Lee

(10) Patent No.: US 10,986,711 B2
(45) Date of Patent: Apr. 20, 2021

(54) LIGHT-EMITTING APPARATUS INCLUDING LIGHT-EMITTING DIODE

(71) Applicant: Seoul Semiconductor Co., Ltd., Ansan-si (KR)

(72) Inventor: Chung Hoon Lee, Ansan-si (KR)

(73) Assignee: SEOUL SEMICONDUCTOR CO., LTD.

( * ) Notice: Subject to any disclaimer, the term of this patent is extended or adjusted under 35 U.S.C. 154(b) by 238 days.

(21) Appl. No.: 16/203,607

(22) Filed: Nov. 29, 2018

(65) Prior Publication Data

US 2019/0166672 A1 May 30, 2019

(30) Foreign Application Priority Data

Nov. 30, 2017 (KR) .................. 10-2017-0163678

(51) Int. Cl.
| | | |
|---|---|---|
| *H05B 45/20* | (2020.01) | |
| *H01L 33/50* | (2010.01) | |
| *G09G 3/20* | (2006.01) | |
| *G09G 3/32* | (2016.01) | |
| *H05B 45/22* | (2020.01) | |

(52) U.S. Cl.
CPC ........... *H05B 45/20* (2020.01); *G09G 3/2003* (2013.01); *G09G 3/32* (2013.01); *H01L 33/50* (2013.01); *H05B 45/22* (2020.01)

(58) Field of Classification Search
CPC ......... H05B 45/20; H05B 45/22; H01L 33/50; G09G 3/2003; G09G 3/32
See application file for complete search history.

(56) References Cited

U.S. PATENT DOCUMENTS

| 7,679,672 B2 | 3/2010 | Chua et al. |
|---|---|---|
| 8,810,271 B2 | 8/2014 | Voltan et al. |
| 9,456,482 B1 | 9/2016 | Pope et al. |
| 10,020,292 B2 | 7/2018 | Stoll et al. |
| 10,202,767 B2 | 2/2019 | Di Trapani |
| 10,408,446 B2 | 9/2019 | Di Trapani |
| 10,420,183 B2 | 9/2019 | Yamakawa et al. |
| 10,441,809 B2 | 10/2019 | Van Bommel et al. |

(Continued)

FOREIGN PATENT DOCUMENTS

| JP | 2001-25511 | 1/2001 |
|---|---|---|
| JP | 2003-517705 | 5/2003 |

(Continued)

OTHER PUBLICATIONS

Office Action dated Nov. 12, 2019, issued in Japanese Patent Application No. 2018-225015.

(Continued)

*Primary Examiner* — Thomas M Sember
(74) *Attorney, Agent, or Firm* — H.C. Park & Associates, PLC

(57) ABSTRACT

A light-emitting apparatus includes a first light emitter configured to emit visible light and including a plurality of light sources having color temperatures different from each other, a second light emitter configured to emit infrared rays, and a controller configured to adjust characteristics of the visible light and the infrared rays by controlling the first and second light emitters, in which each of the light sources includes a light-emitting diode chip and a wavelength conversion unit configured to convert a wavelength rage of light emitted from the light-emitting diode chip.

17 Claims, 11 Drawing Sheets

(56) References Cited

U.S. PATENT DOCUMENTS

| | | |
|---|---|---|
| 10,462,874 B2 | 10/2019 | Maxik et al. |
| 10,473,274 B2 | 11/2019 | Yamakawa et al. |
| 2007/0234691 A1 | 10/2007 | Han et al. |
| 2009/0251057 A1 | 10/2009 | Son et al. |
| 2013/0088155 A1 | 4/2013 | Maxik et al. |
| 2017/0278829 A1 | 9/2017 | Stoll et al. |
| 2018/0054974 A1 | 3/2018 | Vasilenko |

FOREIGN PATENT DOCUMENTS

| | | |
|---|---|---|
| JP | 2006-32350 | 2/2006 |
| JP | 2006-114911 | 4/2006 |
| JP | 2009-540599 | 11/2009 |
| JP | 2012-54031 | 3/2012 |
| JP | 2014-525227 | 9/2014 |
| JP | 2015-18928 | 1/2015 |
| JP | 2015-504581 | 2/2015 |
| JP | 2017-531315 | 10/2017 |
| WO | 2013/128544 | 9/2013 |
| WO | 2015/173770 | 11/2015 |
| WO | 2016/067609 | 5/2016 |
| WO | 2016/154570 | 9/2016 |
| WO | 2016/164186 | 10/2016 |
| WO | 2016/208684 | 12/2016 |
| WO | 2017/080807 | 5/2017 |
| WO | 2017/081660 | 5/2017 |

OTHER PUBLICATIONS

Extended European Search Report dated Mar. 14, 2019, in European Patent Application No. 18209187.6.

LIGHT-EMITTING APPARATUS INCLUDING LIGHT-EMITTING DIODE

CROSS-REFERENCE TO RELATED APPLICATION

This application claims priority from and the benefit of Korean Patent Application No. 10-2017-0163678, filed on Nov. 30, 2017, which is hereby incorporated by reference for all purposes as if fully set forth herein.

BACKGROUND

Field

Exemplary embodiments of the invention relate to a light-emitting apparatus including light-emitting diodes.

Discussion of the Background

Most living things have adapted to act according to a change in sunlight. The human body also has adapted to the sunlight. Accordingly, the human biorhythm is changed according to a change in the sunlight. For example, in the morning, cortisol hormone is secreted due to an influence of bright sunlight. The cortisol hormone helps supplying blood to each organ of the body to cope with an external stimulus, such as stress, so that a person can wake up from sleep and prepare an external activity. In the evening, melatonin hormone is secreted due to an influence of dark sunlight, which reduces blood pressure, thereby helping a person to fall asleep.

In the modern society, there are many persons who spend more time indoors than outdoors under the sunlight. An indoor lighting device differs greatly from the sunlight. For example, the indoor lighting device outputs white light, but does not have a spectrum distributed in a wide wavelength range like the sunlight. When the lighting device can output light having a spectrum similar to that of the sunlight, light emitted from the lighting device would look natural and promote user's health.

The above information disclosed in this Background section is only for understanding of the background of the inventive concepts, and, therefore, it may contain information that does not constitute prior art.

SUMMARY

A light-emitting apparatus according to an exemplary embodiment can output light having a spectrum similar to that of external light.

Additional features of the inventive concepts will be set forth in the description which follows, and in part will be apparent from the description, or may be learned by practice of the inventive concepts.

A light-emitting apparatus according to an exemplary embodiment includes a first light emitter configured to emit visible light and including a plurality of light sources having color temperatures different from each other, a second light emitter configured to emit infrared rays, and a controller configured to adjust characteristics of the visible light and the infrared rays by controlling the first and second light emitters, in which each of the light sources includes a light-emitting diode chip and a wavelength conversion unit configured to convert a wavelength rage of light emitted from the light-emitting diode chip.

The light-emitting apparatus may further include a user interface connected to the controller, in which the controller is configured to disable the second light emitter when an input for prohibiting emission of the infrared rays is received through the user interface.

The light-emitting apparatus may further include an optical sensor configured to sense external light, in which the controller is further configured to acquire a spectrum of the external light by communicating with the optical sensor, and control the first and second light emitters according to the spectrum of the external light.

The light-emitting apparatus may further include a storage medium, in which the controller is further configured to cause the storage medium to store the spectrum of the external light during a first time.

The controller may be further configured to control the first and second light emitters according to the spectrum of the external light stored in the storage medium during a second time.

The light-emitting apparatus may further include a user interface connected to the controller, in which at least one of the first time and the second time may be selected by a user through the user interface.

The light-emitting apparatus may further include a storage medium configured to store a comparison spectrum, in which the controller is configured to acquire the comparison spectrum from the storage medium and control the first and second light emitters according to the comparison spectrum.

The light-emitting apparatus may further include a user interface connected to the controller, in which the controller is configured to control the first and second light emitters according to the comparison spectrum acquired from the storage medium, at a time selected by a user through the user interface.

The light-emitting apparatus may further include control lines connecting the first and second light emitters to the controller, in which the controller may include a driver configured to control the first and second light emitters by applying driving conditions to the control lines.

The light-emitting apparatus may further include an optical sensor configured to sense light emitted from the first and second light emitters, in which the controller is configured to compare a spectrum of the light emitted from the first and second light emitters with the spectrum of the external light, and to control the first and second light emitters according to a result of the comparison.

The second light emitter may include second light-emitting diodes configured to emit infrared rays having different wavelength ranges, the second light-emitting diodes may be connected to the controller through second control lines, and the controller may be configured to individually control the second light-emitting diodes through the second control lines.

The light-emitting apparatus may include an infrared sensor configured to sense infrared rays of external light, in which the controller is configured to enable the first and second light emitters when an intensity of the sensed infrared rays of the external light is less than a predetermined level.

The light-emitting diode chip may be configured to emit light having a wavelength of about 360 nm to about 420 nm.

The driver may be connected to the light sources through a part of the control lines to control the light sources.

The controller may further include a processor configured to determine the driving conditions.

A light-emitting apparatus according to an exemplary embodiment includes a controller, and light-emitting diodes configured to emit visible light and infrared rays having wavelength ranges different from each other in response to a control of the controller, in which the controller is configured to adjust characteristics of the visible light and the infrared rays by controlling the light-emitting diodes according to a comparison spectrum.

The light-emitting diodes may include first light-emitting diodes configured to emit the visible light, and second light-emitting diodes configured to emit the infrared rays.

The light-emitting apparatus may further include a user interface connected to the controller, in which the controller is configured to disable the second light-emitting diodes when input for prohibiting emission of the infrared rays is received through the user interface.

The light-emitting apparatus may further include an optical sensor configured to sense external light, in which the controller is configured to acquire a spectrum of the external light by communicating with the optical sensor, and provides the spectrum of the external light as the comparison spectrum.

The light-emitting apparatus may further include a storage medium, in which the controller is further configured to cause the storage medium to store the spectrum of the external light during a first time, and control the light-emitting diodes according to the spectrum of the external light stored in the storage medium during a second time.

The light-emitting apparatus may further include a storage medium configured to store the comparison spectrum, in which the controller is configured to acquire the comparison spectrum from the storage medium.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
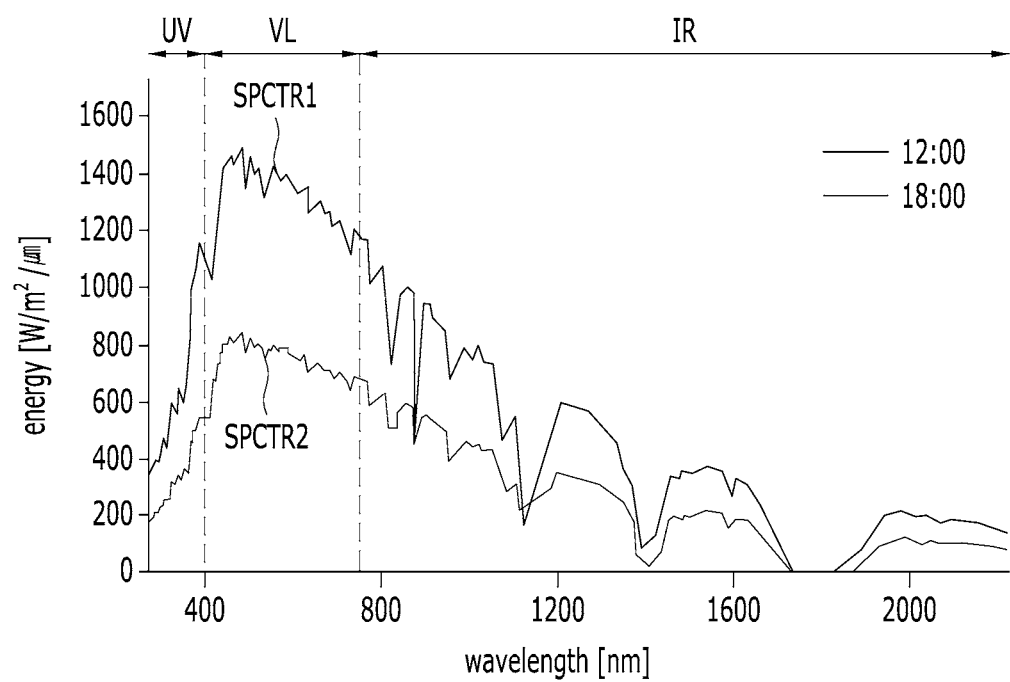
FIG. 1 is a graph illustrating solar spectra measured at different times.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a graph illustrating solar spectra SPCTR1 and SPCTR2 measured at different times of the day. In FIG. 1, a horizontal axis denotes a wavelength and a vertical axis denotes energy.

Referring to FIG. 1, the solar spectra SPCTR1 and SPCTR2 are distributed over a wide wavelength range. Each of the solar spectra SPCTR1 and SPCTR2 is distributed over a wide wavelength range, which includes UV corresponding to ultraviolet rays, VL corresponding to visible light, and IR corresponding to infrared rays.

The first solar spectrum SPCTR1 is measured at 12:00 o'clock and the second solar spectrum SPCTR2 is measured at 18:00 o'clock. The human eye recognizes 12 o'clock sunlight more brightly than 18 o'clock sunlight. As well-known in the art, light recognized by the human eye is visible light. The first solar spectrum SPCTR1 has energy (or intensity) greater than that of the second solar spectrum SPCTR2 in the VL wavelength range corresponding to visible light.

Meanwhile, infrared rays included in the sunlight are not recognized by the human eye, but may have a positive influence on the human body organs. In addition, the infrared rays may be recognized by body organs, such as the skin of human. The infrared rays included in the sunlight also have different levels of energy throughout the day. For example, the first solar spectrum SPCTR1 generally has energy greater than that of the second solar spectrum SPCTR2 in the IR wavelength range corresponding to infrared rays.

As described above, the solar spectra are changed according to the passage of time, and most living things have adapted to act according to a change in the sunlight. When an indoor lighting device may emit both infrared rays and visible light, and the emitted visible light and infrared rays have characteristics similar to those of the sunlight that changes according to the passage of time, the lighting device can provide effects similar to those provided by the sunlight including light of various wavelength ranges, and can be recognized by a person as if light similar to the sunlight is being provided.

Figure 2:
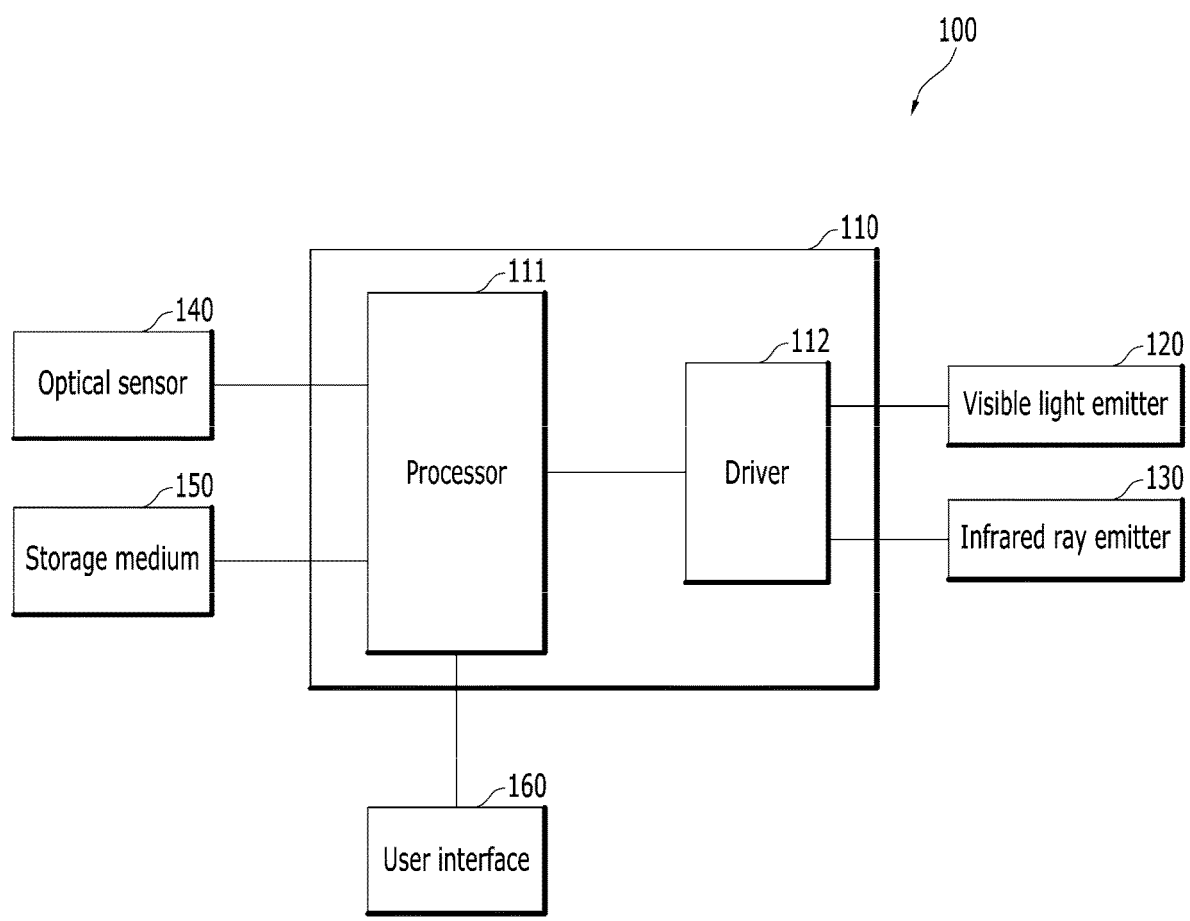
FIG. 2 is a block diagram illustrating a light-emitting apparatus according to an exemplary embodiment.

FIG. 2 is a block diagram illustrating a light-emitting apparatus according to an exemplary embodiment.

Referring to FIG. 2, a light-emitting apparatus 100 may include a controller 110, a visible light emitter 120, an infrared ray emitter 130, at least one optical sensor 140, a storage medium 150, and a user interface 160.

The controller 110 is connected to the visible light emitter 120, the infrared ray emitter 130, the optical sensor 140, the storage medium 150, and the user interface 160. The controller 110 may include a processor 111 and a driver 112.

The processor 111 may control the operations of the light-emitting apparatus 100. For example, the processor 111 may determine driving conditions (or bias conditions) to be applied to the visible light emitter 120 and the infrared ray emitter 130 on the basis of a comparison spectrum, and control the driver 112 to drive the visible light emitter 120 and the infrared ray emitter 130 under the determined driving conditions. According to an exemplary embodiment, the processor 111 may acquire a spectrum of external light (for example, sunlight) by using the optical sensor 140, and uses the spectrum of the external light as the comparison spectrum.

The driver 112 may drive the visible light emitter 120 and the infrared ray emitter 130 under the driving conditions determined by the processor 111. The driver 112 may drive the visible light emitter 120 and the infrared ray emitter 130 according to various schemes. For example, the driver 112 may adjust light to be emitted by adjusting levels of currents which are applied to the visible light emitter 120 and the infrared ray emitter 130. In this case, driving conditions determined by the processor 111 may indicate the levels of the currents. In another example, the driver 112 may adjust light to be emitted by adjusting widths of voltage (or current) pulses which are applied to the visible light emitter 120 and the infrared ray emitter 130. In this case, driving conditions determined by the processor 111 may indicate the widths of the pulses.

The visible light emitter 120 and the infrared ray emitter 130 may emit light having spectrums that change according to the driving conditions. More particularly, a spectrum of visible light may be changed according to the driving conditions applied to the visible light emitter 120, and a spectrum of infrared rays may be changed according to the driving conditions applied to the infrared ray emitter 130.

The visible light emitter 120 may include a plurality of light-emitting diodes that emit visible light of various colors. The driver 112 may individually control the light-emitting diodes according to the driving conditions determined by the processor 111. As such, the intensity of the visible light emitted from each of the light-emitting diodes may be adjusted. Accordingly, the spectrum of the visible light may be changed from mixed colors of light, which indicates that a color temperature is adjusted. For example, at around noon, visible light having a color temperature of about 5,500K may be emitted, and at around sunrise or sunset, visible light having a color temperature of about 4,500K may be emitted.

The infrared ray emitter 130 may include at least one light-emitting diode that emits infrared rays of a predetermined wavelength range. The driver 112 may drive the at least one infrared light-emitting diode according to the driving conditions determined by the processor 111. As such, the intensity of the infrared rays emitted from the infrared ray emitter 130 may be adjusted, and thus, the spectrum of the infrared rays may be changed.

The optical sensor 140 is connected to the processor 111. The optical sensor 140 may sense external light in response to a request from the processor 111, and provide a sensing result to the processor 111. In an exemplary embodiment, the optical sensor 140 may include at least one of various elements for sensing the external light, for example, charge coupled device (CCD) and complementary metal-oxide semiconductor (CMOS) image sensors. In addition, the optical sensor 140 may include an infrared sensor for sensing infrared rays of the external light. In this manner, sensing sensitivity of the optical sensor 140 to the infrared rays may be improved.

In an exemplary embodiment, the optical sensor 140 may provide the processor 111 with source data for generating a spectrum of the external light as a sensing result. In another exemplary embodiment, the optical sensor 140 may generate a spectrum by sensing the external light, and transmit the spectrum of the external light generated as the sensing result to the processor 111.

The storage medium 150 is connected to the processor 111. The storage medium 150 may store a data library for driving conditions. For example, when specific driving conditions are applied to the visible light emitter 120 and the infrared ray emitter 130, the storage medium 150 may store data for a spectrum of output light emitted by the visible light emitter 120 and the infrared ray emitter 130. The spectrum data may be measured while applying driving conditions to the visible light emitter 120 and the infrared ray emitter 130 after they are manufactured. The processor 111 may select driving conditions with reference to the data library stored in the storage medium 150 such that light emitted from the visible light emitter 120 and the infrared ray emitter 130 matches the spectrum of the external light.

In an exemplary embodiment, the storage medium 150 may include at least one of various mediums accessible by the processor 111. For example, the storage medium 150 may include at least one of storage mediums readable by a random access memory (RAM), a read only memory (ROM), and another type of processor 111.

The user interface 160 is connected to the processor 111. The user interface 160 is configured to receive input of a user and transfer the received input to the processor 111. For example, a user may provide an input through the user interface 160 to prohibit emission of infrared rays. In this case, the processor 111 may disable the infrared ray emitter 130 in response to the received input. The infrared ray emitter 130 may be disabled according to various schemes. For example, the driver 112 may include at least one switch capable of blocking driving conditions applied to the infrared ray emitter 130, and may turn on or off the switch under the control of the processor 111. As another example, a user may provide an input through the user interface 160 to prohibit emission of visible light. When the input for prohibiting the emission of the visible light is received, the processor 111 may disable the visible light emitter 120. For example, the driver 112 may include at least one switch capable of blocking driving conditions applied to the visible light emitter 120. In this manner, the light-emitting apparatus 100 may selectively emit visible light and infrared rays according to the selection of a user.

The user interface 160 may further include a module for displaying various types of information related to light emitted by the light-emitting apparatus 100. For example, the processor 111 may cause the user interface 160 to display whether the light-emitting apparatus 100 currently emits infrared rays and/or visible light and the intensities thereof. Furthermore, the processor 111 may cause the user interface 160 to display a color temperature of light currently emitted from the light-emitting apparatus 100. In addition, the processor 111 may cause the user interface 160 to display a spectrum of the light currently emitted from the light-emitting apparatus 100.

According to an exemplary embodiment, the light-emitting apparatus 100 includes the visible light emitter 120 that emits visible light and the infrared ray emitter 130 that emits infrared rays. Furthermore, the light-emitting apparatus 100 may adjust the emitted visible light and infrared rays to have a spectrum similar to that of external light. Therefore, the light emitted from the light-emitting apparatus 100 may have a spectrum similar to that of sunlight in the IR wavelength range corresponding to the infrared rays as well as the VL wavelength range corresponding to the visible light. Accordingly, light emitted from the light-emitting apparatus 100 may look natural and can provide effects similar to those provided by the sunlight.

Figure 3:
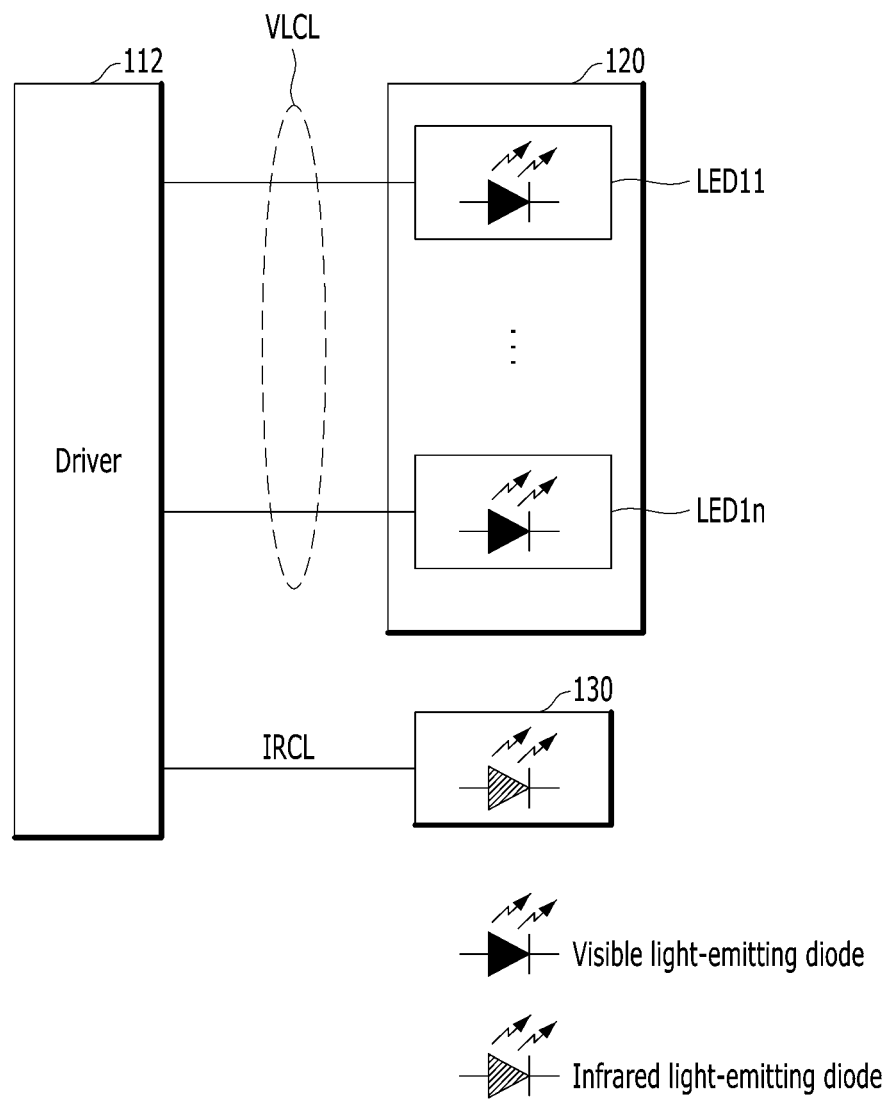
FIG. 3 is a detailed block diagram illustrating a driver, a visible light emitter, and an infrared ray emitter of FIG. 2.

FIG. 3 is a detailed block diagram illustrating the driver, the visible light emitter, and the infrared ray emitter of FIG. 2.

Referring to FIG. 3, the visible light emitter 120 includes first to $n^{th}$ light-emitting diodes LED11 to LED1$n$. The first to $n^{th}$ light-emitting diodes LED11 to LED1$n$ are connected to the driver 112 through visible light control lines VLCL.

The first to $n^{th}$ light-emitting diodes LED11 to LED1$n$ may emit visible light of different wavelength ranges, for example, light having red, green, blue, amber, and cyan colors. The visible light emitted from the first to $n^{th}$ light-emitting diodes LED11 to LED1$n$ may be changed according to driving conditions applied through the visible light control lines VLCL, for example, current levels or pulse widths. When the driving conditions applied to the first to $n^{th}$ light-emitting diodes LED11 to LED1$n$ are changed, the intensity of light of different wavelength ranges may be changed. Therefore, it is possible to change the spectrum of the visible light emitted from the visible light emitter 120.

Each of the first to $n^{th}$ light-emitting diodes LED11 to LED1$n$ may include elements suitable for outputting light of a corresponding wavelength range. In an exemplary embodiment, each of the first to $n^{th}$ light-emitting diodes LED11 to LED1$n$ may include a light-emitting diode chip for emitting light and a wavelength conversion unit for converting the wavelength range of light emitted therefrom. For example, each light-emitting diode may include an ultraviolet light-emitting diode chip and a wavelength conversion unit for converting ultraviolet rays to light of a corresponding wavelength range. More particularly, the ultraviolet light-emitting diode chip may emit light in a wavelength range of about 360 nm to about 420 nm, specifically, about 380 nm to about 420 nm, and more specifically, about 400 nm to about 420 nm. In another example, each light-emitting diode may include a blue light-emitting diode chip and a wavelength conversion unit for converting blue light to light of a corresponding wavelength range. In yet another example, each light-emitting diode may include a light-emitting diode chip for emitting light of a corresponding wavelength range without a wavelength conversion unit.

The infrared ray emitter 130 may include at least one infrared light-emitting diode connected to at least one infrared control line IRCL. When driving conditions applied to the at least one infrared light-emitting diode are changed, the intensity of infrared rays may be changed. Therefore, it is possible to change the spectrum of the infrared rays emitted from the infrared ray emitter 130.

Figure 4:
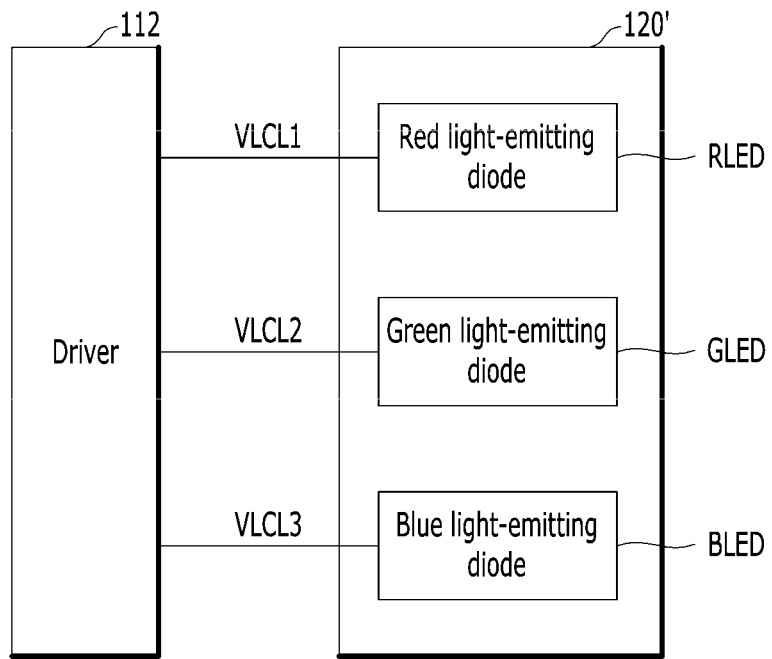
FIG. 4 and FIG. 5 are block diagrams illustrating the visible light emitter of FIG. 3 according to exemplary embodiments.
Figure 5:
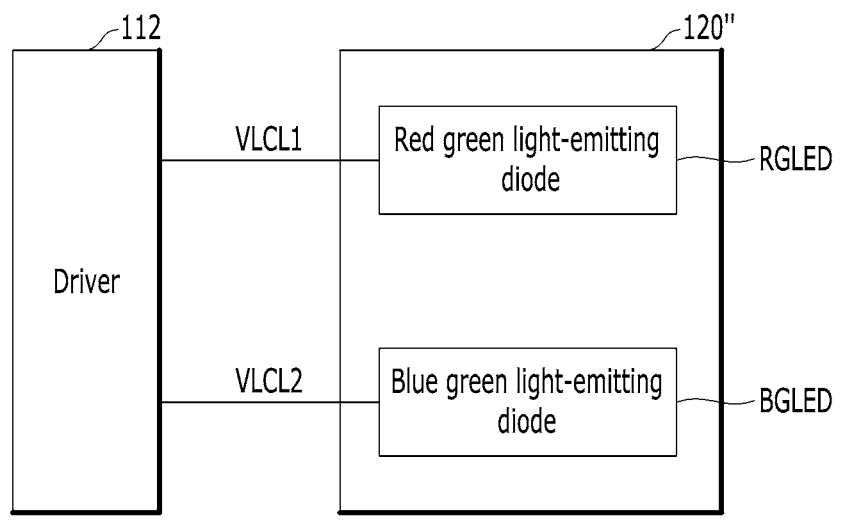

FIG. 4 and FIG. 5 are block diagrams illustrating a visible light emitter according to exemplary embodiments.

Referring to FIG. 4, the visible light emitter 120' according to an exemplary embodiment may include a red light-emitting diode RLED, a green light-emitting diode GLED, a blue light-emitting diode BLED, which are connected to the driver 112 through first, second, and third visible light control lines VLCL1 to VLCL3, respectively. For example, the red light-emitting diode RLED may include a light-emitting diode chip for emitting ultraviolet rays and a red fluorescent substance for converting emitted light to have a red wavelength, the green light-emitting diode GLED may include a light-emitting diode chip for emitting ultraviolet rays and a green fluorescent substance for converting emitted light to have a green wavelength, and the blue light-emitting diode BLED may include a light-emitting diode chip for emitting ultraviolet rays and a blue fluorescent substance for converting emitted light to have a blue wavelength. The intensity of light output from the light-emitting diodes RLED, GLED, and BLED may be adjusted according to driving conditions respectively applied thereto through the first to third visible light control lines VLCL1 to VLCL3. Therefore, color mixing of visible light emitted from the light-emitting diodes RLED, GLED, and BLED may be changed.

Referring to FIG. 5, the visible light emitter 120" according to an exemplary embodiment may include a red green light-emitting diode RGLED and a blue green light-emitting diode BGLED, which are connected to the driver 112 through first and second visible light control lines VLCL1 and VLCL2, respectively. The red green light-emitting diode RGLED emits mixed red and green light, and the blue green light-emitting diode BGLED emits mixed blue and green light. For example, the red green light-emitting diode RGLED may include a light-emitting diode chip for emitting ultraviolet rays, a red fluorescent substance for converting emitted light to have a red wavelength, and a green fluorescent substance for converting the emitted light to have a green wavelength. The blue green light-emitting diode BGLED may include a light-emitting diode chip for emitting ultraviolet rays, a blue fluorescent substance for converting emitted light to have a blue wavelength, and a green fluorescent substance for converting the emitted light to have a green wavelength. The light-emitting diodes RGLED and BGLED may adjust the intensity of output light according to driving conditions respectively applied thereto through the first and second visible light control lines VLCL1 and VLCL2.

Figure 6:
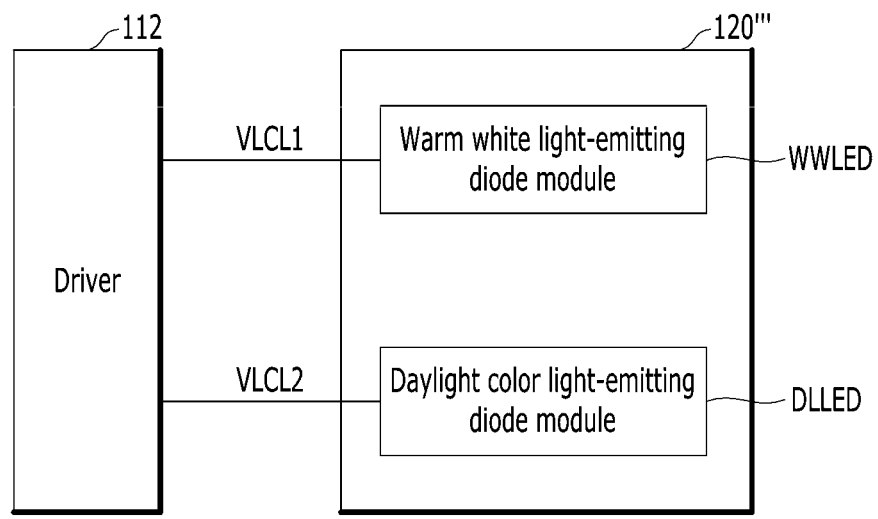
FIG. 6 is a block diagram illustrating the visible light emitter of FIG. 3 according to another exemplary embodiment.

FIG. 6 is a block diagram illustrating a visible light emitter according to another is exemplary embodiment.

Referring to FIG. 6, the visible light emitter 120''' according to an exemplary embodiment may include a warm white light-emitting diode module WWLED and a daylight color light-emitting diode module DLLED, which are connected to the driver 112 through first and second visible light control lines VLCL1 and VLCL2, respectively. The warm white light-emitting diode module WWLED may emit visible light having a color temperature of about 4,000 K (Kelvin), and the daylight color light-emitting diode module DLLED may emit visible light having a color temperature of about 6,500 K. In an exemplary embodiment, each of the warm white light-emitting diode module WWLED and the daylight color light-emitting diode module DLLED may include a plurality of light-emitting diodes, which may have the color temperatures according to color mixing of light emitted from the light-emitting diodes. The light-emitting diodes included in each light-emitting diode module may be commonly controlled by a corresponding visible light control line.

In addition, the visible light emitter 120''' may include combinations of various light-emitting diode modules that emit white light. For example, a light-emitting diode module having a color temperature of about 1,800 K and a light-emitting diode module having a color temperature of about 4,000 K may be provided. In another example, a light-emitting diode module having a color temperature of about 1,800 K, a light-emitting diode module having a color temperature of about 4,000 K, and a light-emitting diode module having a color temperature of about 6,500 K may be provided. In further another example, a light-emitting diode module having a color temperature of about 1,800 K, two light-emitting diode modules having a color temperature of about 4,000 K, and a light-emitting diode module having a color temperature of about 6,500 K may be provided.

Figure 7:
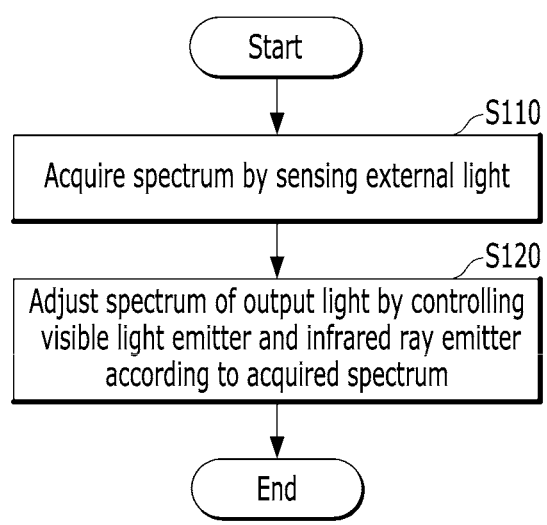
FIG. 7 is a flowchart illustrating an operation method of a light-emitting apparatus according to an exemplary embodiment.

FIG. 7 is a flowchart illustrating an operation method of the light-emitting apparatus according to an exemplary embodiment.

Referring to FIG. 2 and FIG. 7, at step S110, a spectrum is acquired by sensing external light. At step S120, a spectrum of output light is adjusted by controlling the visible light emitter 120 and the infrared ray emitter 130 according to the acquired spectrum of the external light. In this case, the output light includes visible light emitted from the visible light emitter 120 and infrared rays emitted from the infrared ray emitter 130. As described above, the infrared rays as well as the visible light may be adjusted according to the external light, so that light having a spectrum similar to that of the external light may be outputted.

Figure 8:
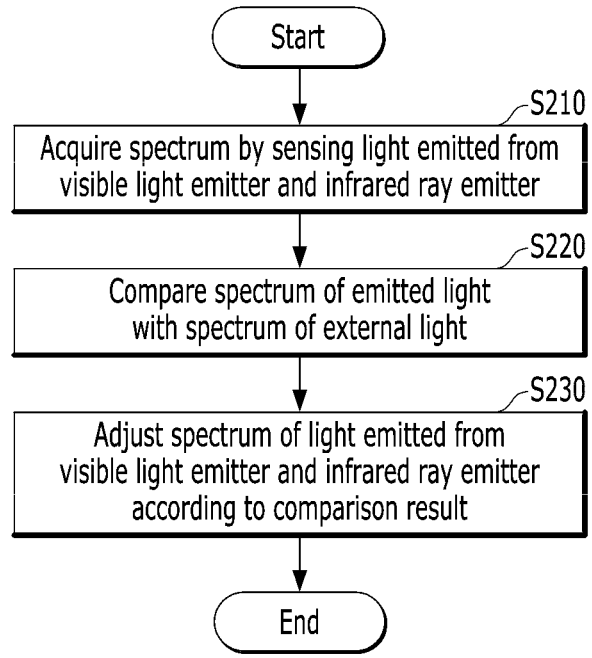
FIG. 8 is a flowchart illustrating the step S120 of FIG. 7 according to an exemplary embodiment.

FIG. 8 is a flowchart illustrating the step S120 of FIG. 7 according to an exemplary embodiment.

Figure 9:
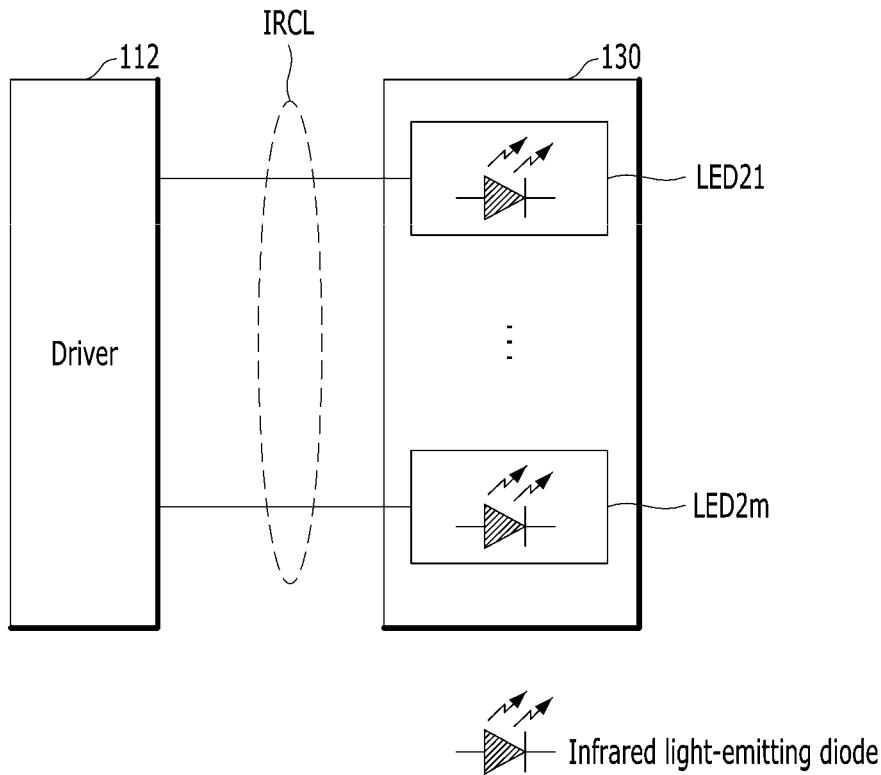
FIG. 9 is a block diagram illustrating the infrared ray emitter of FIG. 3 according to an exemplary embodiment.

Referring to FIG. 2, FIG. 7, and FIG. 9, in some exemplary embodiments, the step S120 described above for adjusting the spectrum of output light may include additional steps to increase accuracy of the adjustment. For example, at step S210, a second spectrum may be acquired by sensing the light emitted from the visible light emitter 120 and the infrared ray emitter 130. The at least one optical sensor 140 may sense the light emitted from the visible light emitter 120 and the infrared ray emitter 130, as well as the external light. In particular, the optical sensor 140 may further sense mixed light outputted from the visible light emitter 120 and the infrared ray emitter 130. In an exemplary embodiment, an optical sensor for sensing the external light and an optical sensor for sensing the output light may be respectively mounted at separate chips. In this case, when each optical sensor is directed to a proper direction, it is possible to efficiently sense desired light.

At step S220, the second spectrum of the emitted light is compared with the spectrum of the external light. At step S230, the spectrums of the light emitted from the visible light emitter 120 and the infrared ray emitter 130 are adjusted according to the comparison result. The processor 111 may compare the second spectrum of the emitted light with the spectrum data stored in the storage medium 150, and then correct driving conditions applied to the visible light emitter 120 and the infrared ray emitter 130 according to the comparison result, thereby outputting light with a desired spectrum. In this case, the processor 111 may update the corrected driving conditions in the storage medium 150.

FIG. 9 is a block diagram illustrating an infrared ray emitter 130 of FIG. 3 according to an exemplary embodiment.

Referring to FIG. 9, the infrared ray emitter 130 includes first to $m^{th}$ light-emitting diodes LED21 to LED2$m$. The first to $m^{th}$ light-emitting diodes LED21 to LED2$m$ are connected to the driver 112 through infrared control lines IRCL.

The first to $m^{th}$ light-emitting diodes LED21 to LED2$m$ may emit infrared rays of different wavelength ranges. The infrared rays emitted from the first to $m^{th}$ light-emitting diodes LED21 to LED2$m$ may be changed according to driving conditions applied through the infrared control lines IRCL, for example, current levels or pulse widths. When the driving conditions applied to the first to $m^{th}$ light-emitting diodes LED21 to LED2$m$ are changed, the intensity of the infrared rays having different wavelength ranges may be changed, and thus, the spectrum of the emitted infrared rays may be changed.

Referring back to FIG. 1, since the sunlight spectrum is also distributed in the IR wavelength range IR corresponding to the infrared rays, when infrared rays having a spectrum similar to that of the sunlight are emitted by adjusting the intensity of the infrared rays of different wavelength ranges in accordance to the spectrum of the external light as described above, light emitted from the light-emitting apparatus 100 may look natural and can provide effects similar to those provided by the sunlight.

Figure 10:
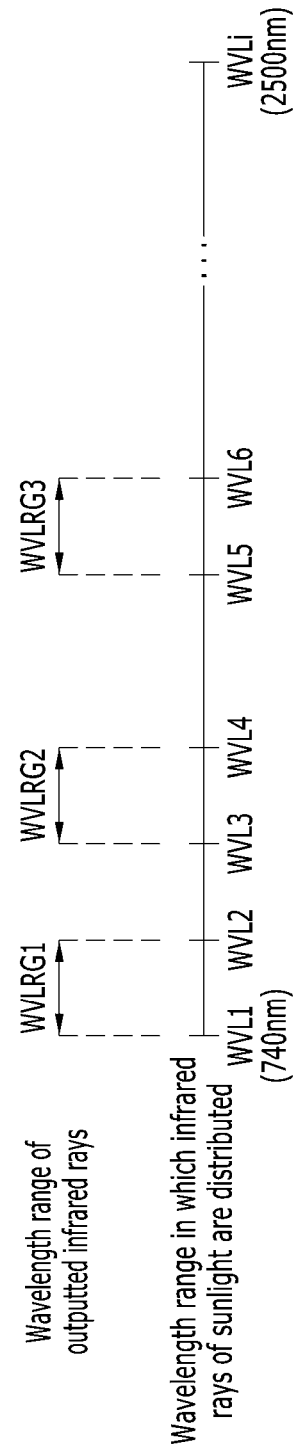
FIG. 10 is a diagram illustrating wavelength ranges of light emitted from the light-emitting diodes of FIG. 9.

FIG. 10 is a diagram illustrating wavelength ranges of light emitted from the first to $m^{th}$ light-emitting diodes LED21 to LED2$m$.

A wavelength of infrared rays of the sunlight are distributed, and thus, may be divided into a plurality of wavelength ranges, as shown in FIG. 10. The first to $m^{th}$ light-emitting diodes LED21 to LED2$m$ may emit infrared rays having wavelength ranges WVLRG1 to WVLRG3 selected from the divided wavelength ranges. FIG. 10 illustrates that the wavelength of infrared rays of the sunlight is distributed from a first wavelength WVL1 to an $i^{th}$ wavelength WVLi. That is, the spectrum of the sunlight may be distributed from the first wavelength WVL1 to the $i^{th}$ wavelength WVLi. For example, the first wavelength WVL1 may be about 740 nm and the $i^{th}$ wavelength WVLi may be about 2,500 nm. In this case, the first to $m^{th}$ light-emitting diodes LED21 to LED2$m$ may emit infrared rays in the first wavelength range WVLRG1 between the first wavelength WVL1 and the second wavelength WVL2, the second wavelength range WVLRG2 between the third wavelength WVL3 and the fourth wavelength WVL4, and the third wavelength range WVLRG3 between the fifth wavelength WVL5 and the sixth wavelength WVL6. In an exemplary embodiment, one or more light-emitting diodes corresponding to each of the first to third wavelength ranges WVLRG1 to WVLRG3 may be provided. Furthermore, when the intensity of the infrared rays of each of the first to third wavelength ranges WVLRG1 to WVLRG3 is adjusted, the sum of the emitted infrared rays may have a spectrum similar to the sunlight spectrum illustrated in FIG. 1.

It is well known in the art that near infrared rays provide various benefits, for example, support of a sterilizing action, activation of cell growth, support of blood circulation, and the like. The wavelength ranges of the infrared rays emitted from the first to $m^{th}$ light-emitting diodes LED21 to LED2$m$ may correspond to the near infrared rays. For example, the wavelength ranges of the infrared rays may belong to about 740 nm to about 1,400 nm. However, the inventive concepts are not limited thereto. For example, the wavelength ranges of the infrared rays emitted from the first to $m^{th}$ light-emitting diodes LED21 to LED2$m$ may be equal to or more than about 1,400 nm.

Figure 11:
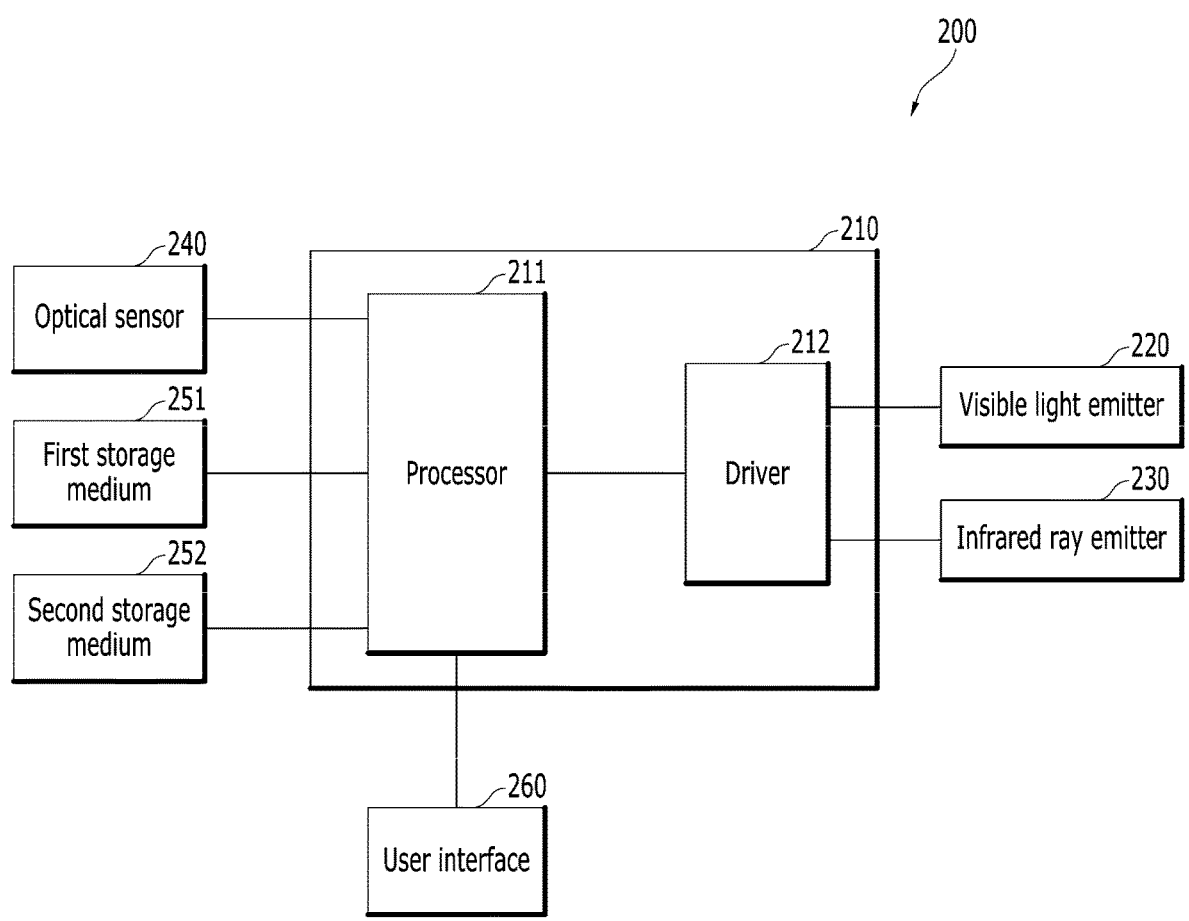
FIG. 11 is a block diagram illustrating a light-emitting apparatus according to an exemplary embodiment.

FIG. 11 is a block diagram illustrating a light-emitting apparatus according to an exemplary embodiment.

Referring to FIG. 11, a light-emitting apparatus 200 according to an exemplary embodiment may include a controller 210, a visible light emitter 220, an infrared ray emitter 230, an optical sensor 240, first and second storage mediums 251 and 252, and a user interface 260. The controller 210 may include a processor 211 and a driver 212. The driver 212, the visible light emitter 220, the infrared ray emitter 230, the optical sensor 240, and the user interface 260 are substantially similar to the driver 112, the visible light emitter 120, the infrared ray emitter 130, the optical sensor 140, and the user interface 160 described with reference to FIG. 2, and thus, repeated descriptions thereof will be omitted to avoid redundancy.

According to the illustrated exemplary embodiment, the processor 211 may acquire a spectrum of external light by using the optical sensor 240, and store the acquired spectrum of the external light in the second storage medium 252 as a comparison spectrum at a specific time. Alternatively, one or more proper optical spectrums may be stored in advance in the second storage medium 252 as a comparison spectrum without the sensing step in the optical sensor 240. In this case, the optical sensor 240 may be omitted.

Then, the comparison spectrum stored in the second storage medium 252 may be used at a different time. At the different time, the processor 211 may read the stored comparison spectrum, determine driving conditions on the basis of the comparison spectrum, and control the driver 212 to drive the visible light emitter 220 and the infrared ray emitter 230 under the determined driving conditions.

In an exemplary embodiment, the processor 211 may acquire a spectrum by sensing light emitted from the visible light emitter 220 and the infrared ray emitter 230 by using the optical sensor 240, compare the spectrum of the emitted light with the stored comparison spectrum, and correct the driving conditions according to the comparison result.

The user interface 260 may receive input regarding a selection of time for sensing the spectrum of the external light. The processor 211 may acquire the spectrum of the external light by using the optical sensor 240 at the selected time and store the acquired spectrum of the external light in the second storage medium 252 as a comparison spectrum.

The user interface 260 may receive input regarding a selection of an emission time according to the comparison spectrum. At the selected time, the processor 211 may determine driving conditions according to the comparison spectrum, and control the driver 212 to drive the visible light emitter 220 and the infrared ray emitter 230 under the determined driving conditions. In this manner, the light-emitting apparatus 200 may emit light, which has a spectrum similar to the comparison spectrum, such as the spectrum of sunlight acquired at a time desired by a user or a proper optical spectrum stored in advance, at a different time. For example, when a user selects multiple times for sensing the spectrum of the external light, and selects multiple times for outputting light according to the selected external light, the light-emitting apparatus 200 may provide light at the times selected by the user, which is similar to sunlight, at different times. In another example, when a user selects optical spectrums stored in advance and selects multiple times for outputting light according to the selected times, the light-emitting apparatus 200 may provide light according to the optical spectrums selected at the times desired by the user.

The first storage medium 251 may be substantially similar to the storage medium 150 of FIG. 2. When specific driving conditions are applied to the visible light emitter 220 and the infrared ray emitter 230, the first storage medium 251 may store data for a spectrum of output light emitted by the visible light emitter 220 and the infrared ray emitter 230. The data stored in the first storage medium 251 may be referred to when the processor 211 determines driving conditions. The second storage medium 252 may store the comparison spectrum as described above. The first storage medium 251 and the second storage medium 252 may be included in one storage medium in which storage areas are logically divided. Alternatively, the first storage medium 251 and the second storage medium 252 may be provided as physically divided storage areas.

Figure 12:
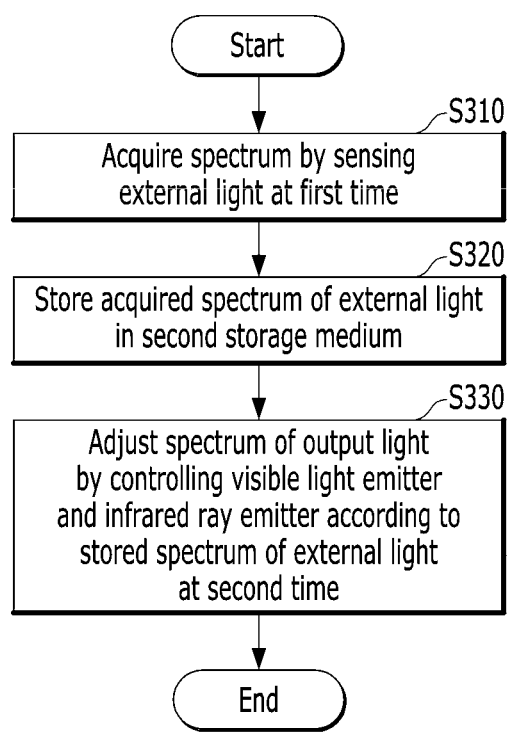
FIG. 12 is a flowchart illustrating an operation method of the light-emitting apparatus according to an exemplary embodiment.

FIG. 12 is a flowchart illustrating an operation method of the light-emitting apparatus according to an exemplary embodiment.

Referring to FIG. 11 and FIG. 12, at step S310, a spectrum is acquired by sensing external light at a first time. At step S320, the acquired spectrum of the external light is stored in the second storage medium 252. At step S330, a spectrum of output light is adjusted by controlling the visible light emitter 120 and the infrared ray emitter 130 according to the stored spectrum of the external light at a subsequent second time. In this manner, the light-emitting apparatus 200 can emit light according to the spectrum of the external light at a different time.

Figure 13:
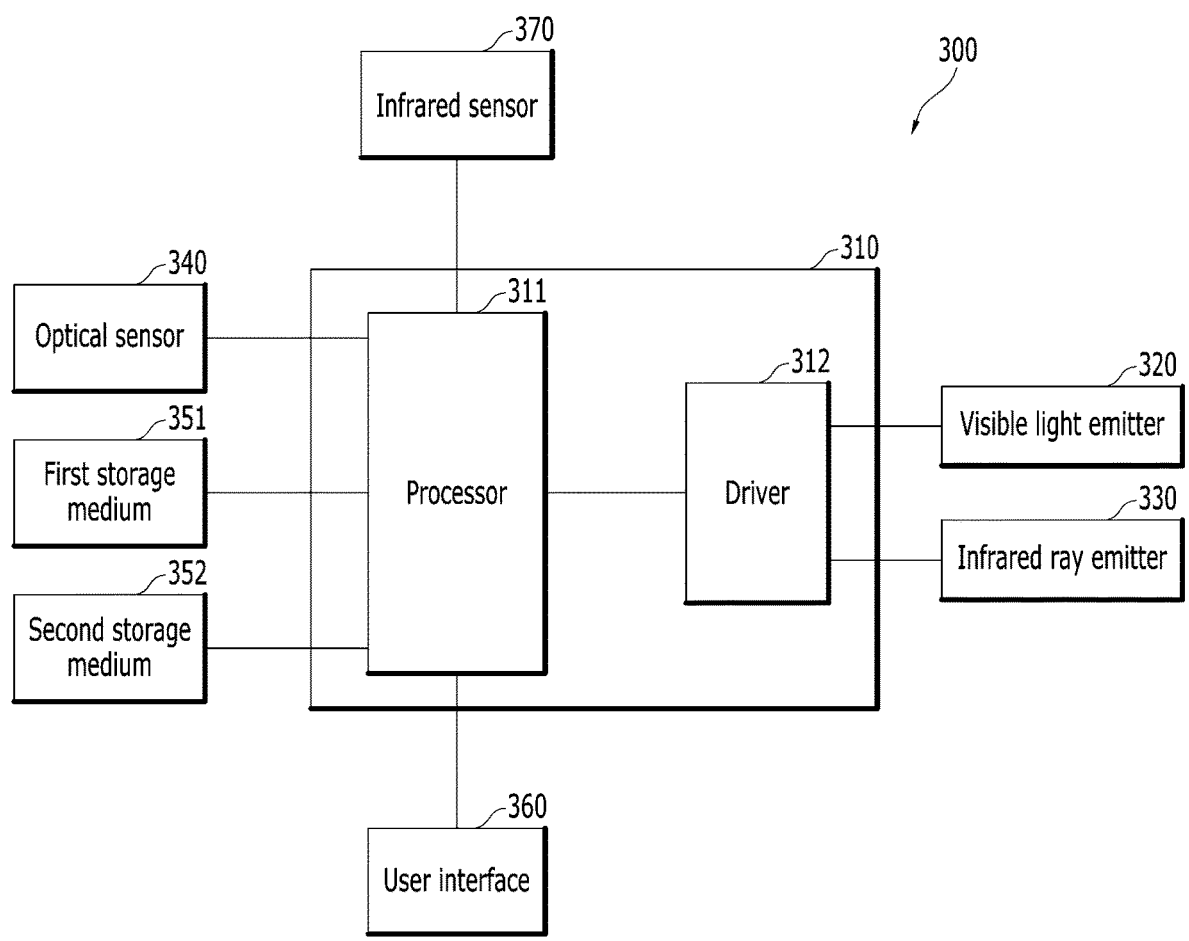
FIG. 13 is a block diagram illustrating a light-emitting apparatus according to an exemplary embodiment.

FIG. 13 is a block diagram illustrating a light-emitting apparatus according to an exemplary embodiment.

Referring to FIG. 13, a light-emitting apparatus 300 may include a controller 310, a visible light emitter 320, an infrared ray emitter 330, an optical sensor 340, first and second storage mediums 351 and 352, a user interface 360, and an infrared sensor 370. The controller 310 may include a processor 311 and a driver 312.

The controller 310, the visible light emitter 320, the infrared ray emitter 330, the optical sensor 340, the first and second storage mediums 351 and 352, and the user interface 360 may be substantially similar to the controller 210, the visible light emitter 220, the infrared ray emitter 230, the optical sensor 240, the first and second storage mediums 251 and 252, and the user interface 260 of FIG. 11. As such, repeated descriptions thereof will be omitted to avoid redundancy.

The infrared sensor 370 according to an exemplary embodiment is connected to the controller 310. The infrared sensor 370 is configured to sense infrared rays of external light. For example, the infrared sensor 370 may be enabled when other elements of the light-emitting apparatus 300 are in a sleep mode, and may sense the infrared rays of the external light. For example, the infrared sensor 370 may sense a wavelength range of about 740 nm to about 1,500 nm, specifically, about 800 nm to about 1,000 nm, more specifically, about 850 nm to about 950 nm.

The processor 311 may enable the visible light emitter 320 and the infrared ray emitter 330 when the intensity of the sensed infrared rays is less than a critical level. In addition, the processor 311 may disable the visible light emitter 320 and the infrared ray emitter 330 when the intensity (or the energy level) of the sensed infrared rays is equal to or greater than the critical level. For example, the driver 312 may include switches capable of blocking or permitting driving conditions applied to the visible light emitter 320 and the infrared ray emitter 330, and turn on or off the switches under the control of the processor 311. According to the illustrated exemplary embodiment, when the intensity of the external light is relatively low, the light-emitting apparatus 300 may emit light without a command of a user for the user's convenience.

In an exemplary embodiment, the infrared sensor 370 may be omitted and its function may be performed by the optical sensor 340.

Figure 14:
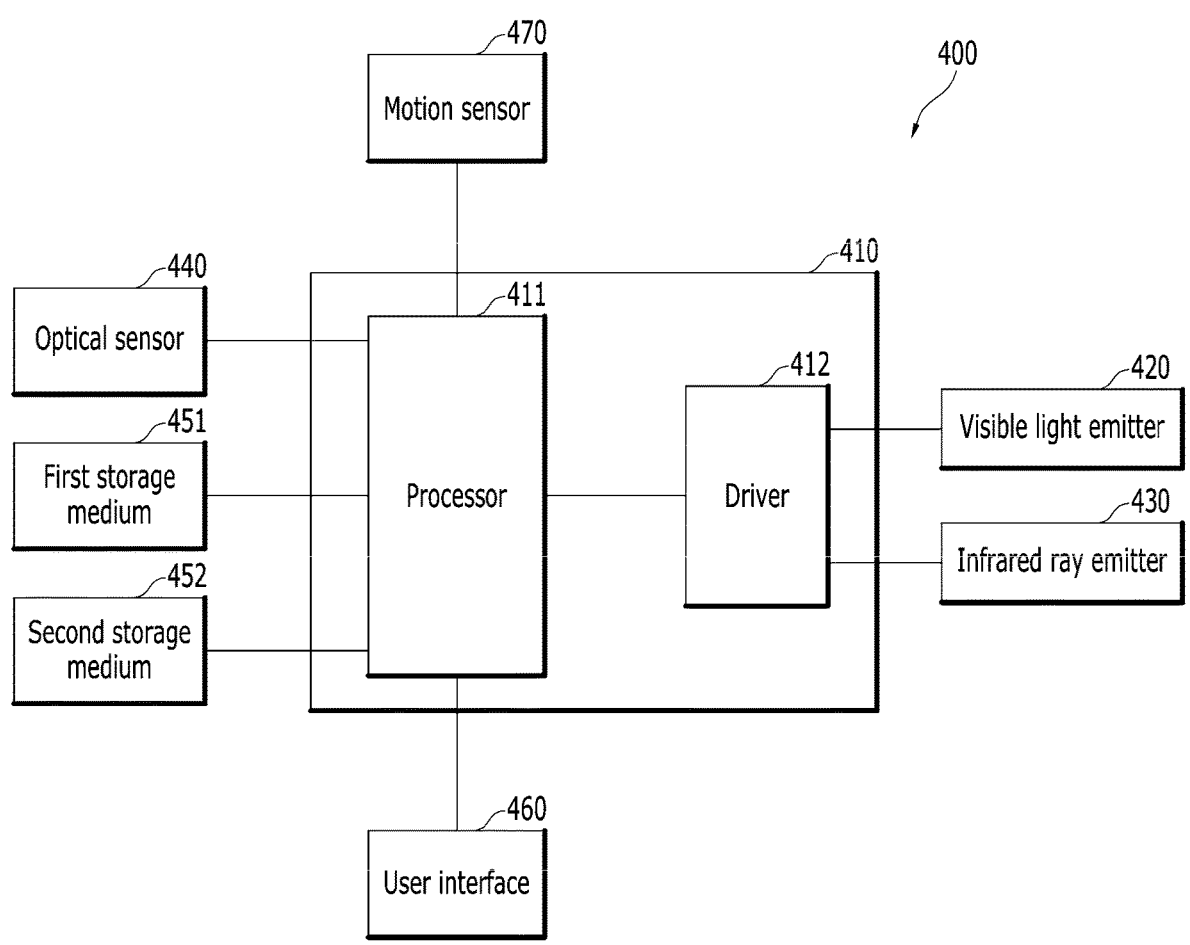
FIG. 14 is a block diagram illustrating a light-emitting apparatus according to another exemplary embodiment.

FIG. 14 is a block diagram illustrating a light-emitting apparatus according to another exemplary embodiment.

Referring to FIG. 14, a light-emitting apparatus 400 according to an exemplary embodiment may include a controller 410, a visible light emitter 420, an infrared ray emitter 430, an optical sensor 440, first and second storage mediums 451 and 452, a user interface 460, and a motion sensor 470.

The controller 410, the visible light emitter 420, the infrared ray emitter 430, the optical sensor 440, the first and second storage mediums 451 and 452, and the user interface 460 may be substantially similar to the controller 210, the visible light emitter 220, the infrared ray emitter 230, the optical sensor 240, the first and second storage mediums 251 and 252, and the user interface 260 of FIG. 11. As such, repeated descriptions thereof will be omitted to avoid redundancy.

The motion sensor 470 is connected to the controller 410. The motion sensor 470 may be configured to detect a motion of an external object. The motion sensor 470 may include any one of various types of motion sensors. For example, the motion sensor 470 may output light or electromagnetic waves, for example, infrared rays, and detect the interruption or reflection of the outputted light or electromagnetic waves, thereby detecting the motion of the external object.

A processor 411 may enable the visible light emitter 420 and the infrared ray emitter 430 when the motion is detected. In addition, when no motion is detected, after a predetermines time passes therefrom, the processor 411 may disable the visible light emitter 420 and the infrared ray emitter 430. According to the illustrated exemplary embodiment, the light-emitting apparatus 400 may emit light when a user is located around the light-emitting apparatus 400 without input of a command from the user, which may provide user convenience.

According to the exemplary embodiments, a light-emitting apparatus may output light having a spectrum substantially similar to that of external light.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light-emitting apparatus comprising:
a first light emitter comprising a plurality of light sources each being configured to emit white light of different color temperatures;
a second light emitter configured to emit infrared rays;
an optical sensor configured to sense external light and to sense light emitted from the first and second light emitters; and
a controller configured to adjust characteristics of the white light and the infrared rays by controlling the first and second light emitters,
wherein each of the light sources comprises a light-emitting diode chip and a wavelength conversion unit configured to convert a wavelength rage of light emitted from the light-emitting diode chip, and
wherein the controller is further configured to acquire a spectrum of the external light by communicating with the optical sensor and compare the spectrum of the external light with a spectrum of the light emitted from the first and second light emitters to control the first and second light emitters according to a result of the comparison.

2. The light-emitting apparatus according to claim 1, further comprising a user interface connected to the controller,
wherein the controller is configured to disable the second light emitter when an input for prohibiting emission of the infrared rays is received through the user interface.

3. The light-emitting apparatus according to claim 1, further comprising a storage medium,
wherein the controller is further configured to cause the storage medium to store the spectrum of the external light during a first time.

4. The light-emitting apparatus according to claim 3, wherein the controller is further configured to control the first and second light emitters according to the spectrum of the external light stored in the storage medium during a second time.

5. The light-emitting apparatus according to claim 4, further comprising a user interface connected to the controller,
wherein at least one of the first time and the second time is selected by a user through the user interface.

6. The light-emitting apparatus according to claim 1, further comprising a storage medium configured to store a comparison spectrum,
wherein the controller is configured to acquire the comparison spectrum from the storage medium and control the first and second light emitters according to the comparison spectrum.

7. The light-emitting apparatus according to claim 6, further comprising a user interface connected to the controller,
wherein the controller is configured to control the first and second light emitters according to the comparison spectrum acquired from the storage medium, at a time selected by a user through the user interface.

8. The light-emitting apparatus according to claim 1, further comprising control lines connecting the first and second light emitters to the controller,
wherein the controller comprises a driver configured to control the first and second light emitters by applying driving conditions to the control lines.

9. The light-emitting apparatus according to claim 8, wherein the driver is connected to the light sources through a part of the control lines to control the light sources.

10. The light-emitting apparatus according to claim 8, wherein the controller further comprises a processor configured to determine the driving conditions.

11. The light-emitting apparatus according to claim 1, wherein:
the second light emitter comprises second light-emitting diodes configured to emit infrared rays having different wavelength ranges;
the second light-emitting diodes are connected to the controller through second control lines; and
the controller is configured to individually control the second light-emitting diodes through the second control lines.

12. The light-emitting apparatus according to claim 1, further comprising an infrared sensor configured to sense infrared rays of external light,
wherein the controller is configured to enable the first and second light emitters when an intensity of the sensed infrared rays of the external light is less than a predetermined level.

13. The light-emitting apparatus according to claim 1, wherein the light-emitting diode chip is configured to emit light having a wavelength of about 360 nm to about 420 nm.

14. A light-emitting apparatus comprising:
a controller;

a first light emitter comprising a plurality of light sources each being configured to emit white light of different color temperatures in response to the control of the controller;

a second light emitter comprising a plurality of second light-emitting diodes configured to emit infrared rays having different wavelength ranges in response to the control of the controller; and an optical sensor configured to sense external light, wherein the controller is configured to acquire a spectrum of the external light by communicating with the optical sensor, and provides the spectrum of the external light as the comparison spectrum to adjust characteristics of the white light and the infrared rays by controlling the first and second light emitters.

15. The light-emitting apparatus according to claim 14, further comprising a user interface connected to the controller, wherein the controller is configured to disable the second light-emitting diodes when input for prohibiting emission of the infrared rays is received through the user interface.

16. The light-emitting apparatus according to claim 14, further comprising a storage medium, wherein the controller is further configured to cause the storage medium to store the spectrum of the external light during a first time, and control the light-emitting diodes according to the spectrum of the external light stored in the storage medium during a second time.

17. The light-emitting apparatus according to claim 14, further comprising a storage medium configured to store the comparison spectrum, wherein the controller is configured to acquire the comparison spectrum from the storage medium.

* * * * *